United States Patent
Liu

(10) Patent No.: US 11,742,394 B2
(45) Date of Patent: Aug. 29, 2023

(54) SEMICONDUCTOR SUBSTRATE AND TRANSISTOR

(71) Applicant: Industrial Technology Research Institute, Hsinchu (TW)

(72) Inventor: Hsueh-Hsing Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 119 days.

(21) Appl. No.: 17/544,960

(22) Filed: Dec. 8, 2021

(65) Prior Publication Data

US 2023/0129528 A1    Apr. 27, 2023

(30) Foreign Application Priority Data

Oct. 27, 2021    (TW) .................. 110139931

(51) Int. Cl.
| | |
|---|---|
| *H01L 29/267* | (2006.01) |
| *H01L 33/12* | (2010.01) |
| *H01L 29/06* | (2006.01) |
| *H01L 33/32* | (2010.01) |
| *H01L 29/205* | (2006.01) |
| *H01L 29/778* | (2006.01) |

(52) U.S. Cl.
CPC ........ *H01L 29/267* (2013.01); *H01L 29/0649* (2013.01); *H01L 33/12* (2013.01); *H01L 29/205* (2013.01); *H01L 29/7786* (2013.01); *H01L 33/32* (2013.01)

(58) Field of Classification Search
CPC . H01L 29/267; H01L 29/0649; H01L 29/205; H01L 29/7786; H01L 29/2003; H01L 29/7787; H01L 33/12; H01L 33/32
See application file for complete search history.

(56) References Cited

U.S. PATENT DOCUMENTS 10,211,294 B2    2/2019    Roberts et al.
2006/0244011 A1*  11/2006   Saxler ................ H01L 29/7783
                                                          257/E29.249

(Continued)

FOREIGN PATENT DOCUMENTS

| CN | 103545348 | 1/2014 |
| JP | 2007503726 | 2/2007 |

(Continued)

OTHER PUBLICATIONS

"Office Action of Taiwan Counterpart Application", dated Apr. 15, 2022, p. 1-p. 7.

(Continued)

*Primary Examiner* — Dao H Nguyen
(74) *Attorney, Agent, or Firm* — JCIPRNET

(57) ABSTRACT

Provided are a semiconductor substrate and a transistor. The semiconductor substrate includes a base, an insulating layer, a semiconductor layer, a wide bandgap diffusion buffer layer and a nucleation layer. The insulating layer is disposed on the base. The semiconductor layer is disposed on the insulating layer. The wide bandgap diffusion buffer layer is disposed on the semiconductor layer, wherein the bandgap of the wide bandgap buffer diffusion layer is higher than 2.5 eV. The nucleation layer is disposed on the wide bandgap diffusion buffer layer, wherein the nucleation layer includes an aluminum-containing layer.

20 Claims, 4 Drawing Sheets

(56) References Cited

U.S. PATENT DOCUMENTS

| | | | |
|---|---|---|---|
| 2007/0086498 A1* | 4/2007 | Ono | H01S 5/162 |
| | | | 372/43.01 |
| 2008/0230785 A1* | 9/2008 | Murphy | H01L 29/2003 |
| | | | 257/E29.253 |
| 2014/0264379 A1* | 9/2014 | Kub | H01L 29/7782 |
| | | | 257/77 |
| 2017/0117376 A1 | 4/2017 | Yang et al. | |
| 2017/0256618 A1* | 9/2017 | Nelson | H01L 33/32 |
| 2021/0193820 A1* | 6/2021 | Cheng | H01L 21/02581 |

FOREIGN PATENT DOCUMENTS

| | | |
|---|---|---|
| JP | 2009527913 | 7/2009 |
| JP | 2013058626 | 3/2013 |
| JP | 2015043414 | 3/2015 |
| TW | I379021 | 12/2012 |
| TW | I740457 | 9/2021 |

OTHER PUBLICATIONS

Tung Luong et al., "RF loss mechanisms in GaN-based high-electron-mobility-transistor on silicon: Role of an inversion channel at the AlN/Si interface: RF loss mechanisms in GaN-based high-electron-mobility-transistor", Physica Status Solidi (A) Applications and Materials, Apr. 2017, pp. 1-8.

Yutaro Yamaguchi et al., "Physical Model of RF Leakage in GaN HEMTs on Si Substrates based on Atomic Diffusion Analysis at Buffer/Substrate Interface", 2016 IEEE Compound Semiconductor Integrated Circuit Symposium (CSICS), Oct. 2016, pp. 1-1.

"Office Action of Japan Counterpart Application", dated Mar. 22, 2023, p. 1-p. 2.

\* cited by examiner

SEMICONDUCTOR SUBSTRATE AND TRANSISTOR

CROSS-REFERENCE TO RELATED APPLICATION

This application claims the priority benefit of Taiwan application Ser. No. 110139931, filed on Oct. 27, 2021. The entirety of the above-mentioned patent application is hereby incorporated by reference herein and made a part of this specification.

BACKGROUND

Technical Field

The present disclosure relates to a semiconductor device, and particularly relates to a semiconductor substrate and a transistor including the semiconductor substrate.

Description of Related Art

In order to enable power devices to have low on-resistance, high switching frequency, high breakdown voltage and high-temperature operation, the gallium nitride (GaN) semiconductor device is currently a popular choice for a high-power device.

SUMMARY

An embodiment of the present disclosure provides a semiconductor substrate including a base, an insulating layer, a semiconductor layer, a wide bandgap diffusion buffer layer and a nucleation layer. The insulating layer is disposed on the base. The semiconductor layer is disposed on the insulating layer. The wide bandgap diffusion buffer layer is disposed on the semiconductor layer, wherein the bandgap of the wide bandgap buffer diffusion layer is higher than 2.5 eV. The nucleation layer is disposed on the wide bandgap diffusion buffer layer, wherein the nucleation layer includes an aluminum-containing layer.

An embodiment of the present disclosure provides a transistor including a semiconductor substrate, a channel layer, a barrier layer, a gate, a source and a drain. The semiconductor substrate includes a base, an insulating layer, a semiconductor layer, a wide bandgap diffusion buffer layer and a nucleation layer. The insulating layer is disposed on the base. The semiconductor layer is disposed on the insulating layer. The wide bandgap diffusion buffer layer is disposed on the semiconductor layer, wherein the bandgap of the wide bandgap buffer diffusion layer is higher than 2.5 eV. The nucleation layer is disposed on the wide bandgap diffusion buffer layer, wherein the nucleation layer includes an aluminum-containing layer. The channel layer is disposed on the nucleation layer. The barrier layer is disposed on the channel layer. The gate is disposed on the barrier layer. The source and the drain are disposed on the barrier layer and respectively located at opposite sides of the gate.

To make the aforementioned more comprehensible, several embodiments accompanied with drawings are described in detail as follows.

DESCRIPTION OF THE EMBODIMENTS

Figure 1A:
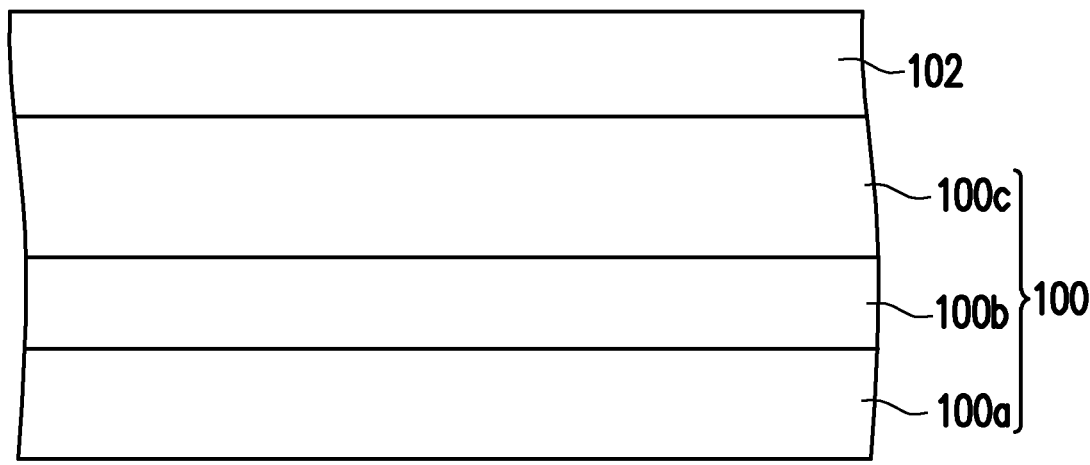
FIGS. 1A to 1B are schematic cross-sectional views of a manufacturing process of a semiconductor substrate of an embodiment of the present disclosure.

The embodiments are described in detail below with reference to the accompanying drawings, but the embodiments are not intended to limit the scope of the present disclosure. In addition, the drawings are for illustrative purposes only and are not drawn to the original dimensions. For the purpose of easy understanding, the same elements in the following description will be denoted by the same reference numerals.

The terms mentioned in the text, such as "comprising", "including" and "having" are all open-ended terms, i.e., meaning "including but not limited to".

When using terms such as "first" or "second" to describe a device, it is only used to distinguish these devices from each other, and does not limit the order or importance of these devices. Therefore, in some cases, the first device can also be called the second device, and the second device can also be called the first device, and this does not deviate from the scope of the present disclosure.

In addition, in the text, the range represented by "a value to another value" is a summary expression way to avoid listing all the values in the range one by one in the specification. Therefore, the record of a specific numerical range covers any numerical value within the numerical range, as well as a smaller numerical range defined by any numerical value within that numerical range.

Figure 1B:
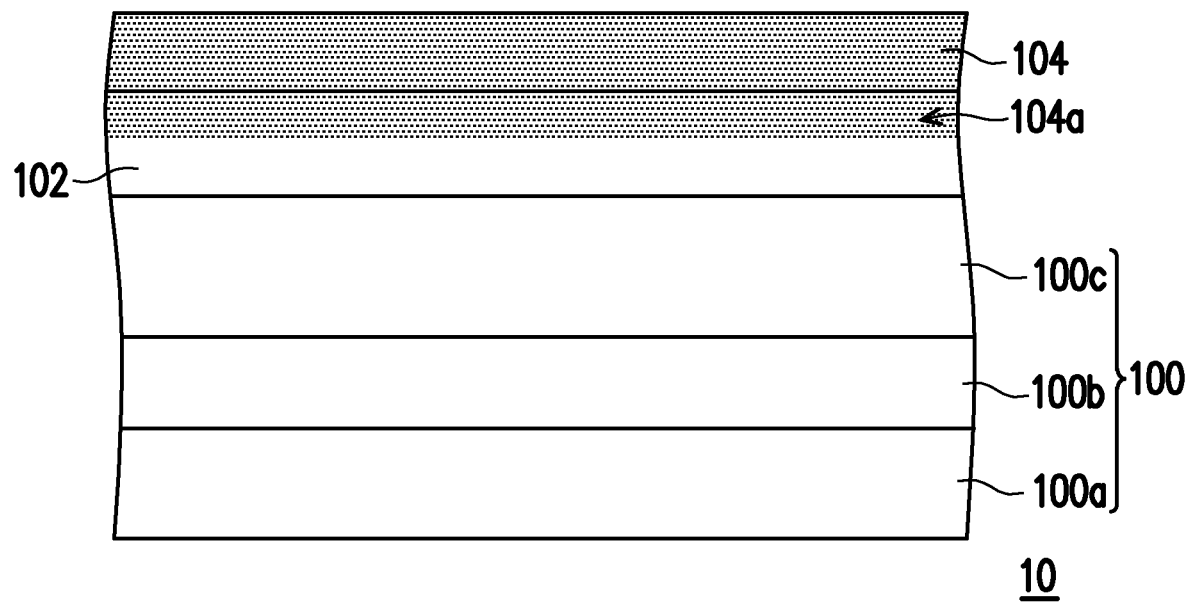

FIGS. 1A to 1B are schematic cross-sectional views of a manufacturing process of a semiconductor substrate of an embodiment of the present disclosure. Referring to FIG. 1A, a composite base 100 is provided. In the present embodiment, the composite base 100 includes a base 100a, an insulating layer 100b and a semiconductor layer 100c. The material of the base 100a is, for example, silicon, aluminum nitride, silicon carbide (SiC), sapphire or a combination thereof. The insulating layer 100b is disposed on the base 100a. The insulating layer 100b is, for example, a silicon oxide layer, but the present disclosure is not limited thereto. The thickness of the insulating layer 100b is, for example, between 100 nm and 200 nm. The semiconductor layer 100c is disposed on the insulating layer 100b. The semiconductor layer 100c is, for example, a silicon layer, a silicon carbide layer or a combination thereof. The thickness of the semiconductor layer 100c is, for example, between 30 nm and 3 μm, preferably between 70 nm and 200 m. In other words, in the present embodiment, the composite base 100 may be a well-known silicon-on-insulator (SOI) composite base or a QST composite base, which has high resistance and is particularly suitable for high-frequency devices. In the present embodiment, the base 100a may have a thermal conductivity greater than 1.4 W/cm·K. As a result, in addition to being used as a supporting base, the composite base 100 may also be used as a heat dissipation base.

Next, a wide bandgap diffusion buffer layer 102 is formed on the semiconductor layer 100c of the composite base 100. In the present embodiment, the energy gap of the wide bandgap diffusion buffer layer 102 is higher than 2.5 eV, preferably between 3.2 eV and 9.1 eV, and more preferably between 4.5 eV and 5.5 eV. The wide bandgap diffusion buffer layer 102 is, for example, a silicon nitride layer, a silicon oxide layer, a zinc oxide layer, an aluminum oxide layer, a gallium oxide layer or a combination thereof. In the present embodiment, the wide bandgap diffusion buffer layer 102 may be an amorphous layer, such as an amorphous silicon nitride layer. In the present embodiment, the thickness of the wide bandgap diffusion buffer layer 102 is between 30 nm and 120 nm, preferably between 35 nm and 100 nm, and more preferably between 40 nm and 90 nm. In the present embodiment, the method for forming the wide bandgap diffusion buffer layer 102 is, for example, a plasma-enhanced chemical vapor deposition (PECVD) process, an E-gun evaporation process or a sputtering deposition process. In addition, in the present embodiment, the wide bandgap diffusion buffer layer 102 may have a resistance value between $1 \times 10^4$ ohm·cm and $1 \times 10^{14}$ ohm·cm.

Referring to FIG. 1B, a nucleation layer 104 is formed on the wide bandgap diffusion buffer layer 102 to make the semiconductor substrate 10 of the present embodiment. In the present embodiment, the nucleation layer 104 is an aluminum-containing layer, such as an aluminum nitride layer, but the present disclosure is not limited thereto.

Generally speaking, when the nucleation layer 104 is formed in a high temperature process, the aluminum contained in the nucleation layer 104 may diffuse into the underlying film. The diffusion of aluminum into the semiconductor layer 100c may form a P-type doped conductive layer. In the present embodiment, since the wide bandgap diffusion buffer layer 102 is formed between the semiconductor layer 100c of the composite base 100 and the nucleation layer 104, the aluminum contained in the nucleation layer 104 may diffuse into the wide bandgap diffusion buffer layer 102 during the high temperature process. When the thickness of the wide bandgap diffusion buffer layer 102 is close to the depth of aluminum diffusion, the aluminum contained in the nucleation layer 104 may be prevented from diffusing into the semiconductor layer 100c to form a P-type doped conductive layer, thereby avoiding the leakage current at the composite base 100 during the operation of the formed semiconductor device. In the present embodiment, the thickness of the wide bandgap diffusion buffer layer 102 is greater than the depth of aluminum diffusion, so the aluminum contained in the nucleation layer 104 may be reliably prevented from diffusing into the semiconductor layer 100c. In addition, since the energy gap of the wide bandgap diffusion buffer layer 102 is higher than 2.5 eV, even if aluminum is diffused into the wide bandgap diffusion buffer layer 102, a P-type doped conductive layer may not be formed.

In addition, in the present embodiment, the material of the wide bandgap diffusion buffer layer 102 may be amorphous. Compared with the single crystal material, the amorphous wide bandgap diffusion buffer layer 102 may effectively reduce the diffusion rate of aluminum contained in the nucleation layer 104 into the semiconductor layer 100c and also reduce the depth of aluminum diffusion into the wide bandgap diffusion buffer layer 102. Generally speaking, the depth of aluminum diffusion is between 50 nm and 100 nm. The wide bandgap diffusion buffer layer 102 may reduce the rate and depth of aluminum diffusion, and thus may reduce the depth of aluminum diffusion to between 40 nm and 90 nm. In a case, the thickness of the wide bandgap diffusion buffer layer 102 may be designed to be 40 nm to 90 nm to prevent aluminum from diffusing into the semiconductor layer 100c.

In the present embodiment, during the formation of the nucleation layer 104 or in the subsequent high temperature process, the aluminum contained in the nucleation layer 104 may diffuse into the wide bandgap diffusion buffer layer 102, and thus a diffusion layer 104a is formed. As shown in FIG. 1B, in the present embodiment, the aluminum contained in the nucleation layer 104 diffuses only into the upper portion of the wide bandgap diffusion buffer layer 102, so that the diffusion layer 104a is formed adjacent to the upper surface of the wide bandgap diffusion buffer layer 102, but the present disclosure is not limited thereto. In other embodiments, the aluminum contained in the nucleation layer 104 may diffuse into the entire wide bandgap diffusion buffer layer 102, that is, the thickness of the diffusion layer 104a may be substantially equal to the thickness of the wide bandgap diffusion buffer layer 102.

Figure 2:
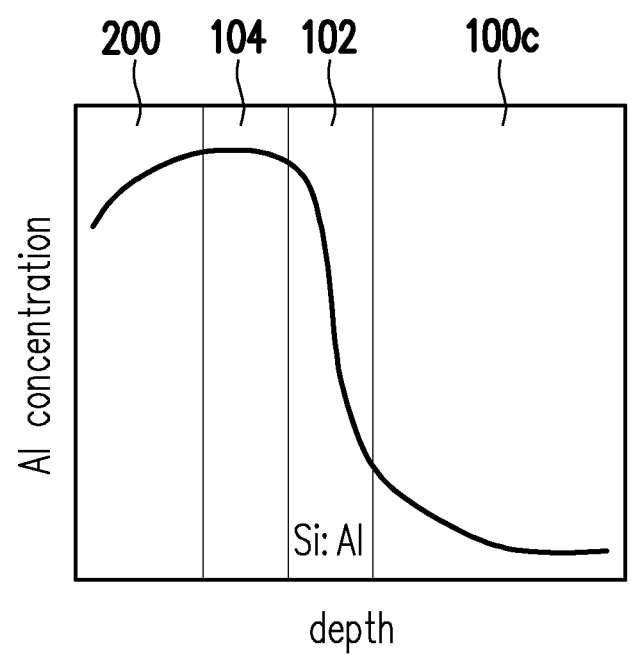
FIG. 2 is a diagram showing the relationship between the aluminum concentration and the diffusion depth of the aluminum in the semiconductor substrate of an embodiment of the present disclosure.

FIG. 2 is a diagram showing the relationship between the aluminum concentration and the diffusion depth of the aluminum in the semiconductor substrate of the embodiment of the present disclosure. Referring to FIG. 2, a buffer layer 200, for example, an AlGaN layer, is formed on the nucleation layer 104 of the semiconductor substrate 10, and the wide bandgap diffusion buffer layer 102 and the nucleation layer 104 are sequentially disposed on the semiconductor layer 100c. In the high temperature process, the aluminum contained in the nucleation layer 104 diffuses upward into the buffer layer 200 and downward into the wide bandgap diffusion buffer layer 102. After the aluminum contained in the nucleation layer 104 diffuses into the wide bandgap diffusion buffer layer 102, the aluminum concentration in the wide bandgap diffusion buffer layer 102 may have a gradient distribution. In other words, in the wide bandgap diffusion buffer layer 102, a relatively large amount of aluminum accumulates in the portion adjacent to the upper surface of the wide bandgap diffusion buffer layer 102, and the aluminum concentration greatly decreases as the diffusion depth increases, so that the aluminum concentration of the portion of the wide bandgap diffusion buffer layer 102 adjacent to the nucleation layer 104 may be greater than that of the portion away from the nucleation layer 104. In addition, since the wide bandgap diffusion buffer layer 102 may reduce or even avoid the diffusion of aluminum contained in the nucleation layer 104 into the semiconductor layer 100c, even when aluminum contained in the nucleation layer 104 penetrates the wide bandgap diffusion buffer layer 102 and diffuses into the semiconductor layer 100c, only a relatively small amount of aluminum is contained in the semiconductor layer 100c. At this time, the aluminum content in the semiconductor layer 100c is, for example, less than $10^{17}$ atom/cm$^3$, or even close to 0. In this way, when the semiconductor substrate 10 is used as the substrate of a transistor, an LED or other electronic device, it may effectively reduce or avoid leakage current and electrical signal loss of the transistor or the LED during operation.

The following will take the semiconductor substrate 10 as an example to describe a transistor including the semiconductor substrate of the present disclosure.

Figure 3:
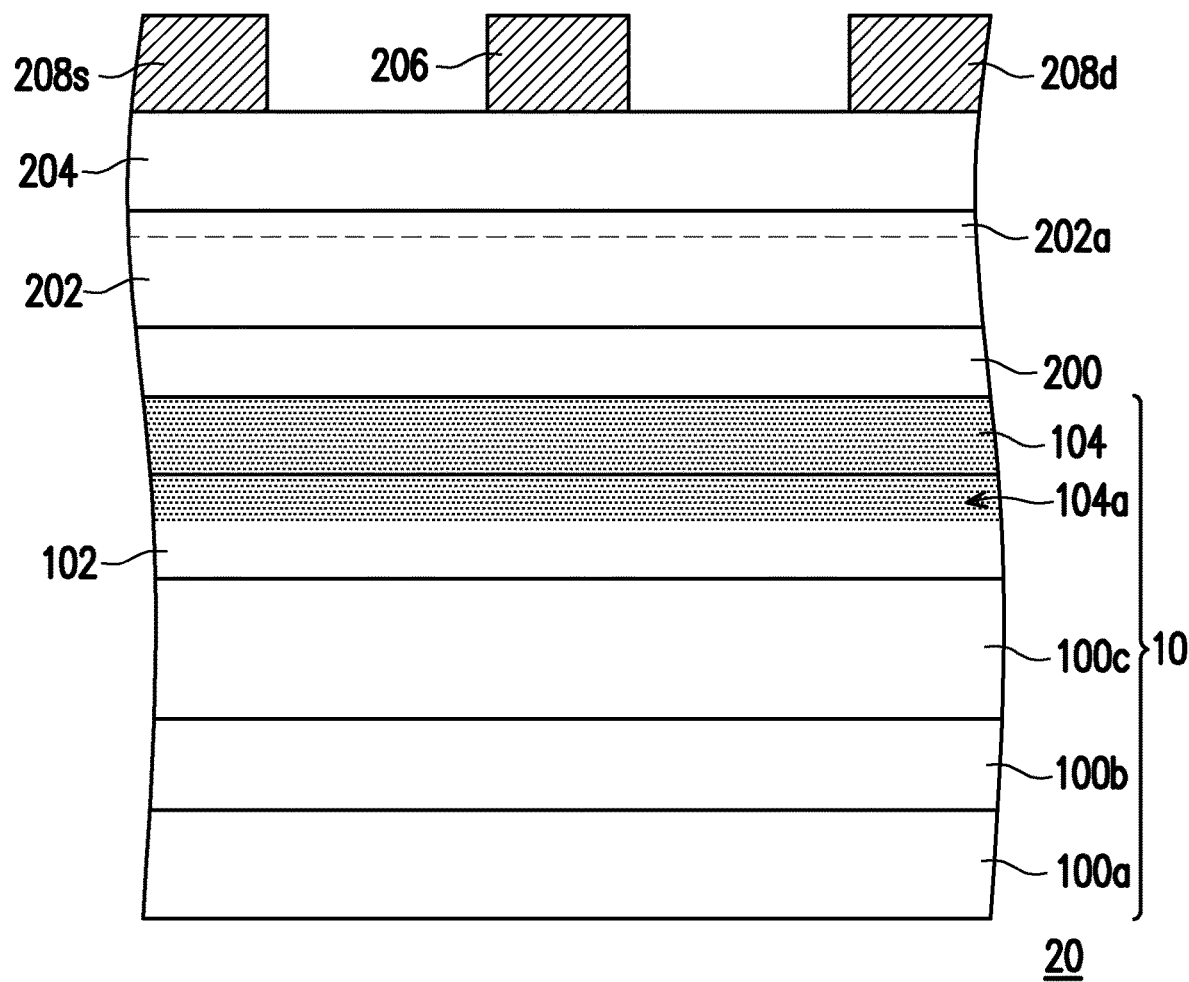
FIG. 3 is a schematic cross-sectional view of a transistor of an embodiment of the present disclosure.

FIG. 3 is a schematic cross-sectional view of a transistor of an embodiment of the present disclosure. Referring to FIG. 3, during the manufacturing process of the transistor 20, a buffer layer 200 may be formed on the nucleation layer 104 of the semiconductor substrate 10. The buffer layer 200 is, for example, an AlGaN layer, but the present disclosure is not limited thereto. Since the difference in the lattice constant between the composite base 100 and the GaN layer grown thereon, stress my be caused and thus affects the quality of the epitaxial layer on the composite base 100. The buffer layer 200 is added between the composite base 100 and the channel layer 202 to balance the stress between the composite base 100 and the epitaxial layer, such as the channel layer 202, subsequently formed thereon. In the present embodiment, the thickness of the buffer layer 200 is, for example, between 100 nm and 2.3 µm. In other embodiments, the buffer layer 200 may be omitted, and the channel layer 202 may directly contact the nucleation layer 104.

Then, the channel layer 202 and a barrier layer 204 are formed in sequence. The channel layer 202 is, for example, a GaN layer. The thickness of the channel layer 202 is, for example, between 20 nm and 100 nm. The barrier layer 204 is, for example, an AlGaN layer, an AlInN layer, an AlN layer, an AlGaInN layer or a combination thereof. The thickness of the barrier layer 204 is, for example, between 5 nm and 50 nm. The channel layer 202 has a two-dimensional electron gas (2DEG) 202a located below an interface between the channel layer 202 and the barrier layer 204. After that, a gate 206, a source 208s and a drain 208d are formed on the barrier layer 204, wherein the gate 206 is located between the source 208s and the drain 208d. The material of the gate 206 is, for example, Ni, Mo, W, TiN or a combination thereof. The material of the source 208s and the drain 208d is, for example, Al, Ti, Au or alloy thereof, or may be other material capable of forming ohmic contact with Group III-V compounds.

In the transistor 20, since the semiconductor substrate 10 is used as the substrate, the leakage current may be effectively reduced or avoided during operation of the transistor 20, and the loss of electrical signals may be reduced or avoided.

In particular, in the present embodiment, transistor 20 is an example of a high electron mobility transistor (HEMT), but the structure of the transistor in the present disclosure is not limited to the HEMT. In other embodiments, the transistor may have various well-known structures, as long as the semiconductor substrate of the present disclosure is used as its substrate.

Figure 4:
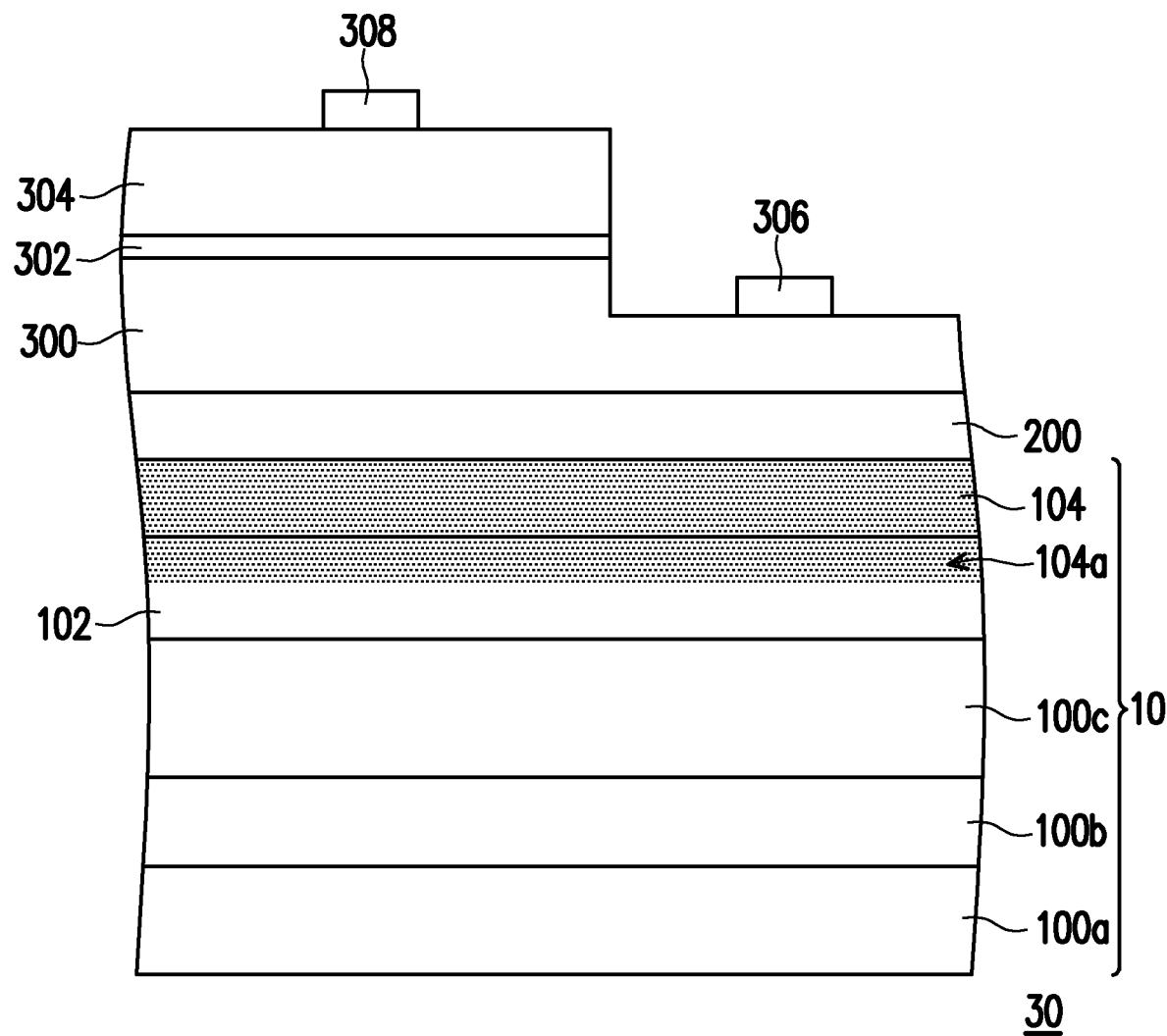
FIG. 4 is a schematic cross-sectional view of a light emitting diode (LED) of an embodiment of the present disclosure.

In addition, when the semiconductor substrate of the present disclosure is used as the substrate of an LED, various LED structures may be formed on the semiconductor substrate of the present disclosure, which is not limited by the present disclosure. For example, as shown in FIG. 4, the LED 30 includes the semiconductor substrate 10, the buffer layer 200, a first conductive type GaN layer 300, a light emitting layer 302, a second conductive type GaN layer 304, a first electrode 306 and a second electrode 308. The light emitting layer 302 is disposed between the first conductive type GaN layer 300 and the second conductive type GaN layer 304. The first electrode 306 is disposed on the first conductive type GaN layer 300. The second electrode 308 is disposed on the second conductive type GaN layer 304. The material of the first conductive type GaN layer 300, the light emitting layer 302, the second conductive type GaN layer 304, the first electrode 306 and the second electrode 308 are well known to those skilled in the art, and will not be further described here.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor substrate, comprising:
    a base;
    an insulating layer, disposed on the base;
    a semiconductor layer, disposed on the insulating layer;
    a wide bandgap diffusion buffer layer, disposed on the semiconductor layer, wherein the energy gap of the wide bandgap diffusion buffer layer is higher than 2.5 eV; and
    a nucleation layer, disposed on the wide bandgap diffusion buffer layer, wherein the nucleation layer comprises an aluminum-containing layer.

2. The semiconductor substrate of claim 1, wherein the wide bandgap diffusion buffer layer comprises a silicon nitride layer, a silicon oxide layer, a zinc oxide layer, an aluminum oxide layer, a gallium oxide layer or a combination thereof.

3. The semiconductor substrate of claim 1, wherein the energy gap of the wide bandgap diffusion buffer layer is between 3.2 eV and 9.1 eV.

4. The semiconductor substrate of claim 1, wherein the resistance value of the wide bandgap diffusion buffer layer is between $1\times10^4$ ohm·cm and $1\times10^{14}$ ohm·cm.

5. The semiconductor substrate of claim 1, wherein the thickness of the wide bandgap diffusion buffer layer is between 30 nm and 120 nm.

6. The semiconductor substrate of claim 1, wherein the wide bandgap diffusion buffer layer is an amorphous layer.

7. The semiconductor substrate of claim 1, wherein the thermal conductivity of the base is greater than 1.4 W/cm·K.

8. The semiconductor substrate of claim 1, wherein a material of the base comprises silicon, aluminum nitride, silicon carbide, sapphire or a combination thereof.

9. The semiconductor substrate of claim 1, wherein the semiconductor layer comprises a silicon layer, a silicon carbide layer or a combination thereof.

10. The semiconductor substrate of claim 1, wherein the aluminum-containing layer comprises an aluminum nitride layer.

11. A transistor, comprising:
    a semiconductor substrate, comprising:
        a base;
        an insulating layer, disposed on the base;
        a semiconductor layer, disposed on the insulating layer;
        a wide bandgap diffusion buffer layer, disposed on the semiconductor layer, wherein the energy gap of the wide bandgap diffusion buffer layer is higher than 2.5 eV; and
        a nucleation layer, disposed on the wide bandgap diffusion buffer layer, wherein the nucleation layer comprises an aluminum-containing layer;
    a channel layer, disposed on the nucleation layer;
    a barrier layer, disposed on the channel layer;
    a gate, disposed on the barrier layer; and
    a source and a drain, disposed on the barrier layer and respectively located at opposite sides of the gate.

12. The transistor of claim 11, wherein the wide bandgap diffusion buffer layer comprises a silicon nitride layer, a silicon oxide layer, a zinc oxide layer, an aluminum oxide layer, a gallium oxide layer or a combination thereof.

13. The transistor of claim 11, wherein the energy gap of the wide bandgap diffusion buffer layer is between 3.2 eV and 9.1 eV.

14. The transistor of claim 11, wherein the resistance value of the wide bandgap diffusion buffer layer is between $1\times10^4$ ohm·cm and $1\times10^{14}$ ohm·cm.

15. The transistor of claim 11, wherein the thickness of the wide bandgap diffusion buffer layer is between 30 nm and 120 nm.

16. The transistor of claim 11, wherein the wide bandgap diffusion buffer layer is an amorphous layer.

17. The transistor of claim 11, wherein the thermal conductivity of the base is greater than 1.4 W/cm·K.

18. The transistor of claim 11, wherein a material of the base comprises silicon, aluminum nitride, silicon carbide, sapphire or a combination thereof.

19. The transistor of claim 11, wherein the semiconductor layer comprises a silicon layer, a silicon carbide layer or a combination thereof.

20. The transistor of claim 11, wherein the wide bandgap diffusion buffer layer contains aluminum.

* * * * *